United States Patent [19]
Ambrosius et al.

[11] Patent Number: 5,128,276
[45] Date of Patent: Jul. 7, 1992

[54] METHOD OF MANUFACTURING A SEMICONDUCTOR DEVICE COMPRISING A MESA

[75] Inventors: Hubertus P. M. M. Ambrosius; Helena J. M. Boerrigter-Lammers, both of Eindhoven, Netherlands

[73] Assignee: U.S. Philips Corporation, New York, N.Y.

[21] Appl. No.: 626,585

[22] Filed: Dec. 7, 1990

[30] Foreign Application Priority Data

Feb. 19, 1990 [NL] Netherlands .................. 9000388

[51] Int. Cl.$^5$ .................. H01L 21/20; H01L 21/203; H01L 21/205
[52] U.S. Cl. .................. 437/129; 437/127; 437/133; 437/944; 372/46
[58] Field of Search .............. 437/129, 912, 944, 127, 437/129, 126; 148/DIG. 100, DIG. 95, DIG. 72; 156/655; 372/48, 46

[56] References Cited

U.S. PATENT DOCUMENTS

| | | | |
|---|---|---|---|
| 3,692,593 | 9/1972 | Haurylo et al. | 148/172 |
| 4,426,700 | 1/1984 | Hirao et al. | 357/17 |
| 4,686,001 | 8/1987 | Okazaki | 156/655 |
| 4,779,282 | 10/1988 | Ng | 372/46 |
| 4,943,540 | 7/1990 | Ren et al. | 156/655 |
| 4,948,753 | 8/1990 | Yoshikawa et al. | 437/129 |
| 4,963,507 | 10/1990 | Amann et al. | 437/129 |

FOREIGN PATENT DOCUMENTS

| | | | |
|---|---|---|---|
| 0139982 | 8/1982 | Japan | 437/129 |
| 0067285 | 4/1986 | Japan | 372/46 |

Primary Examiner—Olik Chaudhuri
Assistant Examiner—Loc Q. Trinh
Attorney, Agent, or Firm—Paul R. Miller

[57] ABSTRACT

A method of manufacturing a semiconductor device, such as a semiconductor diode laser, is set forth to form a mesa and current blocking structure on either side of the mesa. In this technique a lift-off step is used to form a contact layer as a direct result of removing semiconductor layers. This is accomplished by using a selective etchant that removes overlying layers, but does not remove a subjacent layer which may be the contact layer. As a result, the growing process is economized by an inexpensive method having a high yield.

13 Claims, 4 Drawing Sheets

METHOD OF MANUFACTURING A SEMICONDUCTOR DEVICE COMPRISING A MESA

The invention relates to a method of manufacturing a semiconductor device, in which a mesa is formed at a surface of a semiconductor body, after which a semiconductor layer structure is provided on and beside the mesa, which structure comprises at least two semiconductor layers, which are interrupted at the area of the sidewalls of the mesa, whereupon from a semiconductor layer other than the last semiconductor layer the parts of the semiconductor layers located above the mesa are removed by a lift-off step.

BACKGROUND OF THE INVENTION

Such a method is inter alia particularly suitable for the manufacture of so-called buried hetero-junction semiconductor diode lasers, especially if the latter are entirely manufactured by means of OMVPE (=Organo-Metallic Vapour Phase Epitaxy) as a growing technique. However, also other semiconductor diode lasers, such as those of the ridge type, other opto-electronic devices, such as LED's, and photodiodes and electronic devices, such as transistors, may advantageously be manufactured by such a method. More particularly the method is suitable for manufacturing devices in III-V material systems.

Such a method is known from the abstract in the English language of Japanese Kokai 63-177493 (date of publication Jul. 7, 1988), which is published in Pat. Abstracts of Japan, Vol. 12, Nov. 25, 1988, No. 449 (E-686), pag. 81. It is described therein how a mesa is formed at a surface of a semiconductor body comprising a semiconductor substrate provided with two cladding layers, between which an active layer is disposed and on which a top layer is disposed. Subsequently, in a second growing process, by means of MOVPE a semiconductor layer structure is provided on and beside the mesa, which structure comprises two semiconductor layers, which are interrupted at the area of the sidewalls of the mesa and form on either side of the mesa current-blocking layers in a semiconductor diode laser of the buried hetero-junction type to be realized. Finally, from a semiconductor layer other than the last semiconductor layer, in this case from the first semiconductor layer, the parts of the semiconductor layers located above the mesa, in this case of the first and second semiconductor layers, are removed by means of a lift-off step in that the top layer of the mesa is removed by etching. The top layer is removed by means of an etchant selective with respect to the last, in this case the second, semiconductor layer and selective with respect to the subjacent semiconductor layer forming part of the mesa. At the area of the mesa, the upper cladding layer is then exposed.

A disadvantage of the known method is that after the second growing process, in which the current-blocking layers are formed, and after the removal of the parts of said the layers located above the mesa, a third growing process is necessary to finish the semiconductor diode laser. In fact, it is often very difficult and for some materials even substantially impossible to establish a good connection contact directly on the upper cladding layer. As a result, it becomes necessary to provide in a third growing process a semiconductor layer acting as a contact layer. In the known method, use is indeed made of this third growing process. The use of many growing processes is laborious and hence expensive, however, and reduces the yield.

SUMMARY OF THE INVENTION

The present invention has inter alia for its object to provide a method of manufacturing a semiconductor device comprising a mesa, which does not suffer from this limitation or suffers from this limitation at least to a considerably smaller extent. More particularly the present invention has for its object to provide a method, in which a minimum number of growing processes are required.

The invention is based inter alia on the recognition of the fact that the object aimed at is approached more closely when the whole mesa can be remain unattacked.

According to the invention, a method of the kind mentioned in the opening paragraph is characterized in that the lift-off step is carried out by removing the part of the semiconductor layer, other than the last semiconductor layer, located above the mesa by means of an etchant which is selective with respect to a subjacent semiconductor region subjacent or immediately below the removed semiconductor layer and selective with respect to the last semiconductor layer. By the method according to the invention, the parts located above the mesa are removed solely by removing the semiconductor layer other than the last semiconductor layer, and the underlying semiconductor region constituted by the part of the semiconductor layer structure underlying the last-mentioned parts or by the upper part of the mesa is fully maintained. When the semiconductor layer structure comprises, for example, two semiconductor layers, the semiconductor layer other than the last semiconductor layer is necessarily the first semiconductor layer and, after it has been removed, the upper side of the mesa, i.e. the top layer, is maintained and is exposed. The top layer can now act as a contact layer. As a result, an additional growing process for such a layer is superfluous and a connection conductor can be provided on the resulting structure immediately after the lift-off step, as a result of which the manufacture of such a semiconductor device is considerably simplified and has a high yield.

In a first embodiment of a method according to the invention, for the semiconductor layer other than the last semiconductor layer, a first semiconductor material is chosen, and for the subjacent semiconductor region and the last semiconductor layer, another semiconductor material is chosen, while an etchant is chosen for the first semiconductor material which is selective with respect to the another semiconductor material. In this embodiment, when choosing the semiconductor materials of which the semiconductor layers are made, not only desired properties, such as optical and electrical properties, but also the behaviour with respect to various etchants are taken into account. Especially III-V material systems, in which besides binary compounds also ternary or quaternary mixed crystals may be present, suit this purpose. In this manner, for example, a current-blocking structure for a semiconductor diode laser may be provided. Preferably, the height of the mesa and the thicknesses of the semiconductor layers, forming part of the semiconductor layer structure are chosen so that the parts of the last semiconductor layer located on either side of the mesa leave free at least in part the side edges of the part of the semiconductor layer other than the last semiconductor layer located above the mesa and cover at least in part the side edges of the subjacent semiconductor region. As a result, it is achieved, on the one hand, that the selective etchant can reach the part of the semiconductor layer other than the last semiconductor layer located above the mesa and, on the other hand, that the parts of the semiconductor layers disposed under the semiconductor layers other than the last semiconductor layer located above the mesa or, when the subjacent semiconductor region forms part of the mesa, the part of the mesa located under the last-mentioned semiconductor region are not reached by the etchant and are therefore not etched, irrespective of the material of which they consist. In case the semiconductor layer structure comprises only two semiconductor layers, the first-mentioned consideration already ensues from the fact that these layers are interrupted at the area of the sidewalls of the mesa, but the present invention is not limited at all to a method in which only two semiconductor layers are used. A favourable variation is obtained when the thickness of the semiconductor layer structure immediately beside the mesa is chosen to be approximately equal to the height of the mesa. Thus, it is achieved that the surface of the semiconductor body does not exhibit an abrupt step at the side edges of the mesa, which permits obtaining a good coverage with, for example, a metal layer serving as a connection conductor.

A further embodiment of a method according to the invention, in which the semiconductor device constitutes a radiation-emitting semiconductor diode, is characterized in that the semiconductor body is formed by successively providing on a semiconductor substrate of a first conductivity type: a first cladding layer of the first conductivity type, an active layer, a second cladding layer of a second conductivity type opposite to the first conductivity type and a contact layer of the second conductivity type and of a first semiconductor material, after which by etching a strip-shaped mesa is formed, which comprises at least the contact layer and a part of the second cladding layer, whereupon the semiconductor layer structure is provided on and beside the mesa, which structure successively comprises a first passive layer of the second conductivity type and of a second semiconductor material, a second passive layer of the first conductivity type and of the second semiconductor material and a further contact layer of the second conductivity type and of the first conductivity material, while, after the parts of the passive layers and of the further contact layer located above the mesa have been removed, the semiconductor substrate and the contact layers are provided with connection conductors. By this embodiment, a semiconductor diode laser or a LED having excellent properties is obtained, which is manufactured by means of only two growing processes, which is one growing process less than in the known method.

Another embodiment, in which the semiconductor device constitutes a semiconductor diode laser or an LED, is characterized in that the semiconductor body is formed by etching a strip-shaped mesa in a semiconductor substrate of a first conductivity type, after which the semiconductor layer structure is provided on and beside the mesa, which structure successively comprises a first cladding layer of the first conductivity type, an active layer, a second cladding layer of a second conductivity type opposite to the first conductivity type, a contact layer of the second conductivity type and of a first semiconductor material, a first passive layer of the second conductivity type and of a second semiconductor material, a second passive layer of the first conductivity type and of the second semiconductor material, and a further contact layer of the first conductivity type and of the first semiconductor material, while, after the parts of the passive layers and the further contact layer located above the mesa have been removed, the semiconductor substrate and the contact layers are provided with connection conductors. This embodiment has the advantage that only one growing process is required to manufacture the semiconductor diode laser or LED, which is very favourable. This variation and the preceding variation have the advantage that the first semiconductor material can be chosen so that a low-ohmic electrical contact can be formed thereon, as a result of which the contact can extend not only over the mesa, but also on either side thereof, while the first and second passive layers form a blocking p-n junction and can comprise the same second semiconductor material suitable to form a satisfactorily blocking p-n junction. The part of the first passive layer located above the mesa is then etched selectively with respect to the upper part of the mesa, that is to say selectively with respect to the contact layer and selectively with respect to the further contact layer.

A very suitable method is obtained when for the semiconductor substrate, GaAs, for the active layer, GaAs or AlGaAs, for the cladding layers AlGaAs, and for the first semiconductor material, GaAs, and for the second semiconductor material, $Al_xGa_{1-x}As$, is chosen, the aluminium content x being chosen to be equal to at least 30 at. %. For this material system, in which optoelectronic components—such as lasers—having a short wavelength can be manufactured, suitable etchants are available, such as a mixture of $H_2O$, $H_2O_2$ and $NH_4OH$, by means of which GaAs can be etched selectively with respect to AlGaAs having an aluminium content of at least 30 at. % or concentrated HCl by which (at 60° C.) AlGaAs having a content of Al larger than or equal to 60% can be etched selectively with respect to GaAs or AlGaAs having a content of Al smaller than or equal to about 30%. For the manufacture of components having a greater wavelength, for the semiconductor substrate and the cladding layers, InP, and for the active layer, InGaAs(P), can be chosen, while for the first semiconductor material, InGaAs(P), and for the second semiconductor material, InP, is chosen. For selectively etching InGaAsP with respect to InP and conversely, different etchants commonly used in practice are available. For the method according to the embodiments, a strip-shaped mesa is often chosen, which is a suitable geometry for many optoelectronic devices, while for the substrate the (001) orientation is chosen. Preferably, for the longitudinal direction of the mesa the (110) direction is chosen, while for providing the semiconductor layer structure the MOVPE (=Metal-Organic Vapour Phase Epitaxy) technique is chosen as a growing technique because in this case a semiconductor layer structure on a mesa is obtained, which is interrupted at the area of the side edges of the mesa.

BRIEF DESCRIPTION OF THE DRAWINGS

The invention will now be described more fully with reference to three embodiments and the accompanying drawing, in which.

Figure 1:
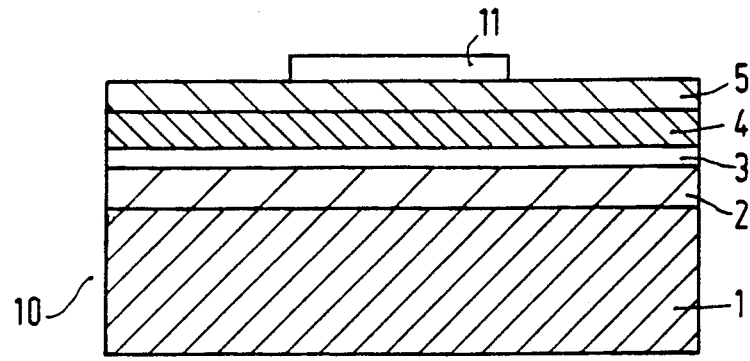
FIGS. 1, 2, 3, 4 and 5 show a first embodiment of a method according to the invention for the manufacture of a semiconductor diode laser with reference to a cross-section approximately perpendicular to the longitudinal direction of the semiconductor diode laser at successive stages of the manufacture.

The Figures are schematic and not drawn to scale, while in particular the dimensions in the direction of thickness are exaggerated for the sake of clarity. Corresponding parts are generally designated by the same reference numerals in the various embodiments. Semiconductor regions of the same conductivity type are generally cross-hatched in the same direction.

DESCRIPTION OF THE INVENTION

Figure 2:
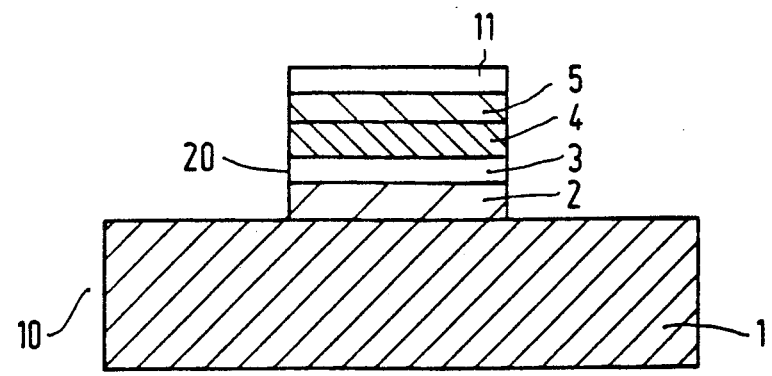
Figure 3:
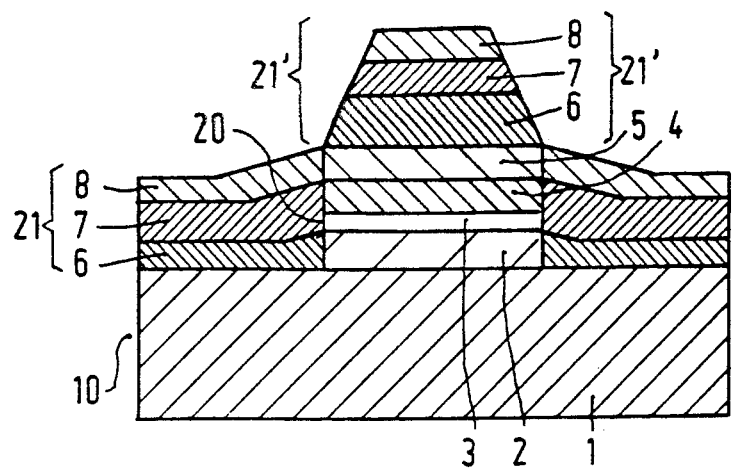
Figure 4:
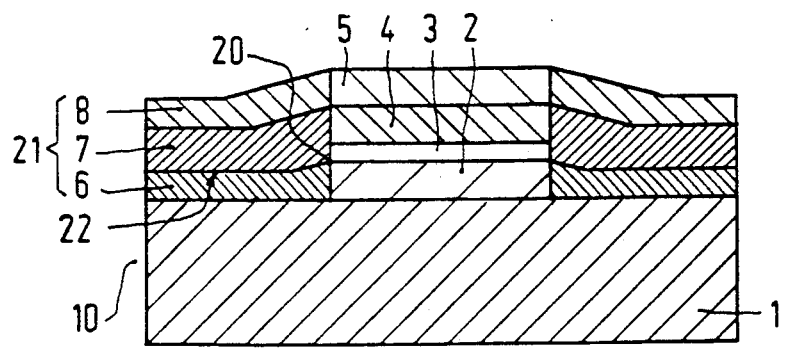
Figure 5:
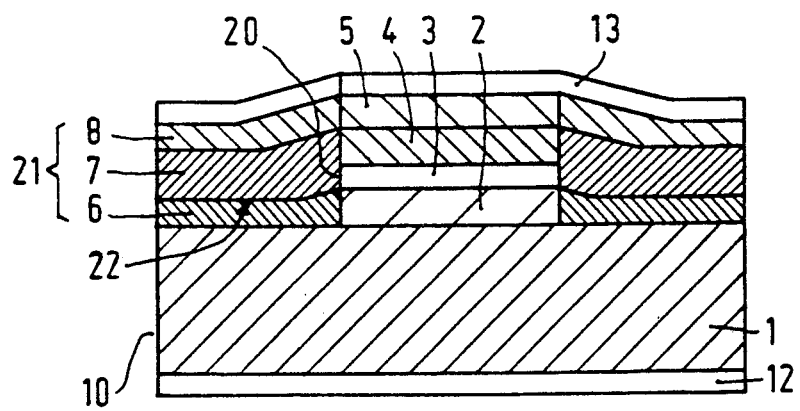

FIGS. 1 to 5 show a first embodiment of the method according to the invention for the manufacture of a semiconductor diode laser with reference to a cross-section approximately perpendicular to the longitudinal direction of the semiconductor diode laser at successive stages of the manufacture. When forming a semiconductor body 10, the starting material is a substrate 1 of monocrystalline n-type GaAs having a doping concentration of 2 to $5 \times 10^{18}$ at/cm$^3$, and having a thickness of about 350 μm and a (001) orientation. By means of MOVPE, there are successively grown on this substrate: an about 1.4 μm thick first cladding layer 2 of n-type AlGaAs having an Al content of about 50% and a doping concentration of about $1 \times 10^{18}$ at/cm$^3$, an about 0.15 μm thick active layer 3 of not intentionally doped AlGaAs having an Al content of about 13%, an about 1.4 μm thick second cladding layer 4 of p-type AlGaAs having about the same Al content and the same doping concentration as the first cladding layer 2 and an about 0.6 μm thick contact layer 5 of p-type GaAs having a doping concentration of about $1 \times 10^{19}$ at/cm$^3$ (see FIG. 1). Subsequently, a strip-shaped photolacquer mask 11 is provided thereon, whose longitudinal direction coincides with the [110] crystal direction, after which by means of RIE (=Reactive Ion Etching) with an etchant comprising Cl$_2$ and Ar in a ratio of 1:4 a strip-shaped mesa 20 is provided under the mask 11, a cross-section of this mesa perpendicular to the longitudinal direction being approximately rectangular (see FIG. 2). After the mask 11 has been removed, the semiconductor body 10 is placed again in the growing apparatus, in which by means of MOVPE a semiconductor layer structure 21 is provided on the semiconductor body 10 comprising the mesa 20, which structure comprises at least two semiconductor layers 6, 8 (in this case three such layers 6, 7, 8), in this case an about 1 μm thick first passive layer 6 of p-type AlGaAs having an Al content of about 50% and a doping concentration of about 10$^{18}$ at/cm$^3$, an about 1.15 μm thick second passive layer 7 of n-type AlGaAs having an Al content of about 50% and a doping concentration of about 10$^{18}$ at/cm$^3$ and an about 0.4 μm thick further contact layer 8 of p-type GaAs having a doping concentration of about 10$^{19}$ at/cm$^3$. The passive layers 6 and 7 and the further contact layer 8 are located both on (21') and on either side of (21) the mesa 20, while they are interrupted at the side edges of the mesa 20 and have beside the mesa 20 together a thickness of about 2.55 μm, while the mesa 20 has a height of about 3.65 μm and a width of about 4.0 μm. With the layer thicknesses chosen, the surface of the further contact layer 8 substantially adjoins the surface of the contact layer 5 (see FIG. 3). This is due to the fact that immediately beside the mesa the growth of the layers 6, 7, B takes place along (311) planes, as a result of which these layers are thicker immediately beside the mesa 20 than slightly farther remote from the mesa 20. The rate of growth in the [311] direction is about 1.15 that of the rate of growth in the [001] direction. By means of a lift-off step, from the semiconductor layer other than the last semiconductor layer, in this case the first passive layer 6, the parts (21') of the semiconductor layers 6, 7 and 8 located above the mesa 20 are then removed (see FIG. 4). According to the invention, this lift-off step is carried out in that from the semiconductor layer other than the last semiconductor layer, in this case the first passive layer 6, the part located above the mesa 20 is removed by means of an etchant which is selective with respect to a subjacent semiconductor region, in this case the part of the contact layer 5 located in the mesa 20, and is selective with respect to the last semiconductor layer, in this case the further contact layer 8. The last-mentioned layer 8 according to the invention covers at least in part the side edges of the part of the contact layer 5 located in the mesa 20 and leaves free at least in part the side edges of the part of the first passive layer 6 located above the mesa 20. As a result, the part of the passive layer 6 located above the mesa 20 is readily accessible for the etchant, while the part of the second cladding layer 44 forming part of the mesa 20 is not accessible. As etchant use is made of concentrated HCl at 60° C., by which AlGaAs having an Al content of 50% (=Al content of the first passive layer 6) is etched selectively with respect to the contact layer and the further contact layer 8 both comprising GaAs. The conductivity type of the passive layers 6, 7 is chosen so that these layers form during operation a current-blocking p-n junction 22. The high Al content of the layers 6, 7 suits this purpose and further results in a lateral enclosure of the electromagnetic radiation to be produced in the active layer 3. The further contact layer 8 comprises the same material and has the same conductivity type and the same doping concentration as the contact layer 5, as a result of which a very good contact can also be established on the further contact layer 8. As a result, semiconductor diode lasers are obtained having a lowest possible connection resistance. After cleaning, the semiconductor body 10 is provided on the lower side and on the upper side, for example by means of sputtering, with a connection conductor 12 comprising Au-Ge-Ni and a connection conductor 13 comprising Pt-Au, respectively. After the semiconductor body 10 has been cleft at two areas parallel to the plane of the drawing (see FIG. 5), at which areas a mirror surface is formed, the semiconductor diode laser obtained is ready to be finished. The semiconductor diode layer, thus manufactured by a method according to the invention is obtained by means of only two growing processes, which influences very favourably the yield and the cost of manufacture.

Figure 6:
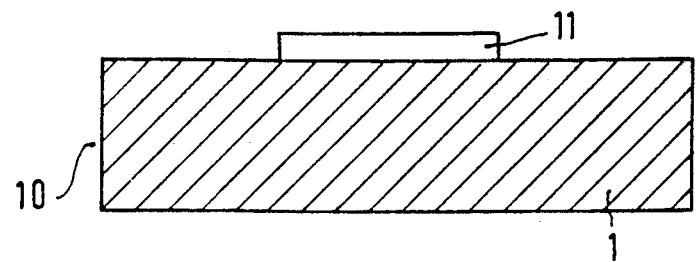
FIGS. 6, 7, 8, 9 and 10 show a second embodiment of the method according to the invention for the manufacture of a semiconductor diode laser with reference to a cross-section approximately perpendicular to the longitudinal direction of the semiconductor diode laser at successive stages of the manufacture.
Figure 7:
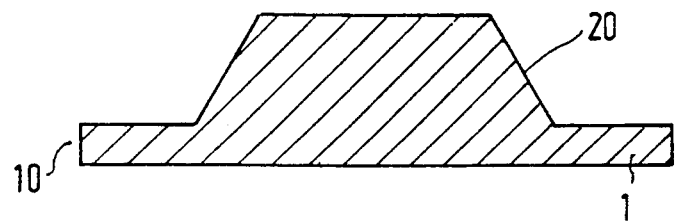
Figure 8:
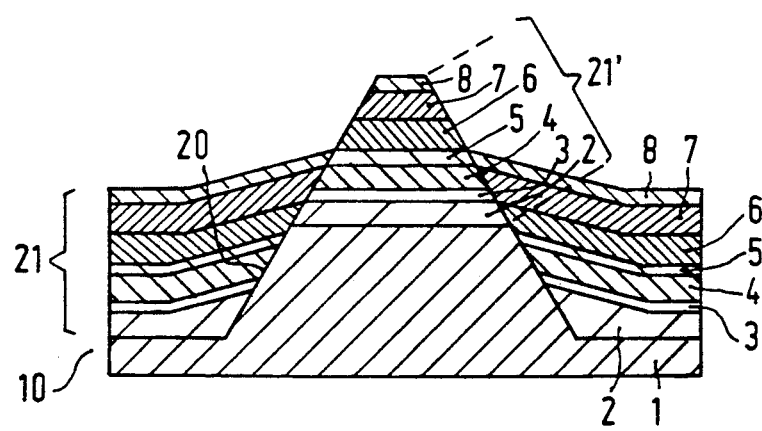
Figure 9:
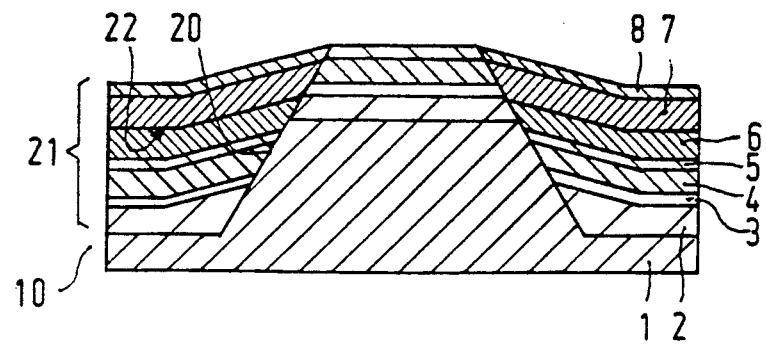
Figure 10:
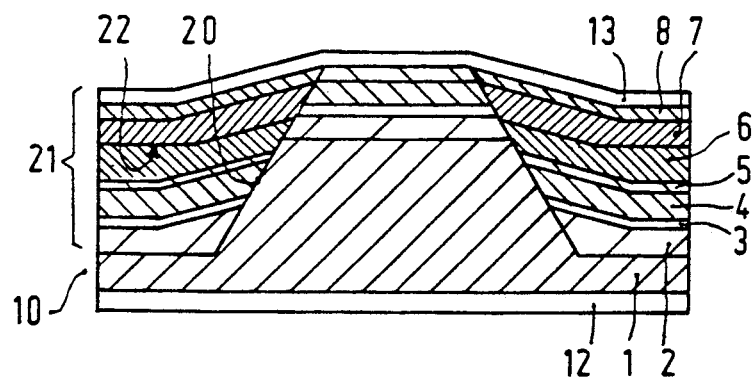

FIGS. 6 to 10 show a second embodiment of a method according to the invention for the manufacture of a semiconductor diode laser with reference to a cross-section approximately perpendicular to the longitudinal direction of the semiconductor diode laser at successive stages of the manufacture. When forming a semiconductor body 10, the starting material is a substrate 1 of monocrystalline n-type GaAs having a doping concentration of 2 to $5 \times 10^{18}$ at/cm$^3$, having a thickness of about 350 μm and a (001) orientation. Subsequently, a strip-shaped photolacquer mask 11 (see FIG. 6) is provided thereon, whose longitudinal direction coincides with the [110]crystal direction, after which by means of an etchant comprising H$_2$O$_2$ and oxalic acid (about 0.4M and pH about 1.0) a strip-shaped mesa 20 is etched under the mask 11, the side edges (111)B of this mesa forming surfaces (see FIG. 7). After the mask 11 has been removed, the semiconductor body 10 is placed in the growing apparatus, after which by means of MOVPE a semiconductor layer structure 21 is provided on the semiconductor body 10 comprising the mesa 20, which structure comprises at least two, in this case seven, semiconductor layers 2, 3, 4, 5, 6, 7, 8, i.e. an about 0.9 μm thick first cladding layer 2 of n-type AlGaAs having an Al content of about 50% and a doping concentration of about $10^{18}$ at/cm$^3$, an about 0.15 μm thick active layer 3 of not intentionally doped AlGaAs having an Al content of about 13%, an about 0.95 μm thick second cladding layer 4 of p-type AlGaAs having approximately the same Al content and the same doping concentration as the first cladding layer 2, an about 0.6 μm thick contact layer 5 of p-type GaAs having a doping concentration of about $1 \times 10^{19}$ at/cm$^3$, an about 0.6 μm thick first passive layer 6 of n-type AlGaAs having an Al content of about 50% and a doping concentration of about $10^{18}$ at/cm$^3$, an about 0.5 μm thick second passive layer 7 of p-type AlGaAs having an Al content of about 50% and a doping concentration of about $10^{18}$ at/cm$^3$ and an about 0.3 μm thick further contact layer 8 of p-type GaAs having a doping concentration of about $1 \times 10^{19}$ at/cm$^3$. The semiconductor layer structure 21, 21' thus formed is thus located both on the side of (21) and above (21') the mesa 20, while the semiconductor layers 2 to 8 inclusive thereof are interrupted at the area of the side edges and together have beside the mesa 20 a thickness of about 4 μm. The height of the mesa 20 is about 6 μm and the width on the upper side is about 6 μm. With the layer thicknesses chosen, the surface of the contact layer 8 substantially adjoins the surface of the contact layer 5 (see FIG. 8). The reason thereof is explained in the preceding embodiment. Subsequently, by means of a lift-off step, from the semiconductor layer other than the last semiconductor layer, here the first passive layer 6, the parts (21') of the semiconductor layers 6, 7 and 8 located above the mesa 20 are removed. According to the invention, this lift-off step is carried out in that from the semiconductor layer other than the last semiconductor layer, here the first passive layer 6, the part located above the mesa 20 is removed by an etchant which is selective with respect to a subjacent semiconductor region, here the part of the contact layer 5 located above the mesa 20, and is selective with respect to the last semiconductor layer, here the further contact layer 8. According to the invention, the latter covers at least in part the side edges of the part of the contact layer 5 located above the mesa 20 and leaves free at least in part the side edges of the part of the first passive layer 6 located above the mesa 20. As a result, the part of the passive layer 6 located above the mesa 20 is readily accessible for the etchant, while the part of the second cladding layer 4 located above the mesa 20 is not accessible. As etchant use is made of concentrated HCl at 60° C., by which AlGaAs having an Al content of 50% (Al content of the first passive layer 6) is etched selectively with respect to the contact layer 5 and the further contact layer 8 both comprising GaAs. The use in this embodiment of two passive layers 6, 7 permits according to the invention forming the blocking p-n junction 22 between the semiconductor layers 6, 7 having a high Al content and consequently a high band gap, which favours the blocking properties. Also a good electrical contact with the semiconductor layer structure 21 on either side of the mesa 20 is obtained because a GaAs layer is chosen for the further contact layer 8. After cleaning, the semiconductor body 10 is treated in the same manner as in a preceding embodiment. The semiconductor diode layer thus manufactured by a method according to the invention is obtained by means of only one growing process, which very favourably influences the yield and the manufacturing cost.

The invention is not limited to the embodiments described since for a person skilled in the art many modifications and variations are possible within the scope of the invention. For example, semiconductor materials or compositions other than those mentioned in the embodiments may be used. More particularly it should be noted that for forming a blocking structure only two semiconductor layers are required and that this number is exactly the minimum number of layers with which the invention can be used. It should be noted that semiconductor layers both comprising AlGaAs may also be etched selectively with respect to each other provided that the Al content of the layer to be etched is at least 30 at. % higher than that of the other layer with respect to which selectivity is desired. If, for example, the upper part of the mesa comprises GaAs, a first passive layer may comprise Al$_{0.6}$Ga$_{0.4}$As and a second passive layer may comprise Al$_{0.3}$Ga$_{0.7}$As and a third layer is not necessary. Also if instead of a blocking p-n junction a high-ohmic layer is used to limit the current, two layers are sufficient. In the embodiments, the semiconductor layer structure always comprises three semiconductor layers, which, as explained therein, has great advantages, but is not essential to the invention. Instead of semiconductor diode lasers, other optoelectronic components, such as LED's, photodiodes, radiation conductors and optical switches may also be manufactured advantageously by a method according to the invention. The same applies to non-optical electronic components, such as transistors, for example HEMT (=High Electron Mobility Transistor) devices, in which a semiconductor body comprising a mesa is used for the manufacture. It should further be noted that the semiconductor diode lasers manufactured according to the embodiments are all of the "buried hetero" type. However, the method according to the invention may also be used for the manufacture of other semiconductor diode lasers comprising a mesa, such as those of the "ridge-waveguide" type, etc. Finally, it should again be noted that the invention is not limited to providing on and beside the mesa a semiconductor layer structure comprising exactly two semiconductor layers. Three and more semiconductor layers are also possible. With regard to the portion of the part of the semiconductor layer structure present on the mesa that is removed, there is now a possibility of choice. In general, if the semiconductor layer structure comprises N layers, there are N−1 possibilities, N−2 possibilities of these N−1 possibilities implying that after the lift-off process one or more semiconductor layers are present not only on either side of the mesa, but also above the mesa. As shown, this fact can be utilized advantageously in some applications. Which possibilities can be chosen depends not only upon the material properties of the semiconductor layers, but also upon the thickness of the semiconductor layer structure and upon the height of the mesa.

We claim:

1. A method of manufacturing a semiconductor device comprising the steps of
    (a) forming a mesa at a surface of a semiconductor body,
    (b) forming at least two semiconductor layers on said mesa and beside said mesa on said surface of said semiconductor body, said at least two semiconductor layers being interrupted at side walls of said mesa, and
    (c) lifting-off said at least two semiconductor layers on said mesa by selectively etching one of said at least two semiconductor layers contacting aid mesa, said etching step being carried out by using an etchant that etches only said one of said at least two semiconductor layers contacting said mesa, thereby leaving said mesa and surrounding portions of said at least two semiconductor layers at said sidewalls of said mesa.

2. A method according to claim 1, wherein said one of said at least two semiconductor layers is a first semiconductor material, and wherein a top layer of said at least two semiconductor layers and said mesa are a second semiconductor material.

3. A method according to claim 2, wherein said mesa is formed to a height and aid at least two semiconductor layers are formed with thicknesses such that side edges of said one of said at least two semiconductor layers on said mesa are exposed to be etched by said etchant.

4. A method according to claim 3, wherein said thicknesses of said at least two semiconductor layers immediately next to said mesa are chosen to be approximately equal to said height of said mesa.

5. A method according to claim 1, wherein aid semiconductor body is formed at a (001) orientation, wherein mesa is formed to be strip-shaped having a longitudinal direction of a (110) orientation, and wherein said at least two semiconductor layers are formed by a MOVPE growth technique.

6. A method according to claim 1, wherein said mesa is formed by a reactive ion etching said semiconductor body.

7. A method according to claim 1, wherein said mesa is formed by a preferential etchant, said preferential etchant forming said sidewalls of said mesa with (111) B surfaces.

8. A method according to claim 1, wherein said mesa is formed of at least four semiconductor layers, and wherein at least three semiconductor layers are formed on and beside said mesa.

9. A method according to claim 8, further comprising forming a radiation-emitting semiconductor device, wherein said step (a) is carried out by successively providing on said surface of said semiconductor body a first cladding semiconductor layer of a first conductivity type, an undoped active semiconductor layer, a second cladding semiconductor layer of a second conductivity type, and a first contact semiconductor layer of said second conductivity type said first contact semiconductor layer being of a first semiconductor material, and then etching a strip-shaped form, wherein said at least three semiconductor layers are formed on and beside said mesa by successively forming a first passive semiconductor layer of said second conductivity type, said first passive semiconductor layer being of a second semiconductor material, a second passive semiconductor layer of said first conductivity type, said second passive semiconductor layer being of said second semiconductor material, and a further contact semiconductor layer of said second conductivity type, said further contact semiconductor layer being of said first semiconductor material, and wherein after step (c) a further step is carried out of forming connection conductors on said semiconductor body and on said first and further contact layers.

10. A method according to claim 9, wherein said semiconductor body is formed of GaAs, wherein aid undoped active semiconductor layer is formed of one of GaAs and AlGaAs, wherein said first and second cladding semiconductor layers are formed of AlGaAs, wherein said first semiconductor material is GaAs, and wherein said second semiconductor material is $Al_xGa_{1-x}As$, where x is chosen to be equal to at least approximately 30 at. %.

11. A method according to claim 1, wherein said mesa is formed from said semiconductor body, and wherein at least seven semiconductor layers are formed on said mesa and beside said mesa on said surface of said semiconductor body.

12. A method according to claim 11, further comprising forming a radiation-emitting semiconductor device, wherein said step (a) is carried out by etching a strip-shaped mesa in said semiconductor body, wherein said step (b) is carried out by successively providing on said mesa and beside said mesa a first cladding semiconductor layer of a first conductivity type, an undoped active semiconductor layer, a second cladding semiconductor layer of a second conductivity type, a first contact semiconductor layer of said second conductivity type, said first contact semiconductor layer being of a first semiconductor material, a first passive semiconductor layer of said second conductivity type, said first passive semiconductor layer being of a second semiconductor material, a second passive semiconductor layer of said first conductivity type, said second passive semiconductor layer being of said second semiconductor material, and a further contact semiconductor material of said first conductivity type, said further contact semiconductor material being of said first semiconductor material, and wherein after said step (c) a further step is carried out of forming connection conductors on said semiconductor body and on said first and further contact layers.

13. A method according to claim 12, wherein said semiconductor body is formed of GaAs, wherein said undoped active semiconductor layer is formed of one of GaAs and AlGaAs, wherein said first and second cladding semiconductor layers are formed of AlGaAs, wherein said first semiconductor material is GaAs, and wherein aid second semiconductor material is $Al_xGa_{1-x}As$, where x is chosen to be equal to at least approximately 30 at. %.

* * * * *